United States Patent
Machalica et al.

(10) Patent No.: US 11,599,695 B2
(45) Date of Patent: Mar. 7, 2023

(54) SYSTEMS AND METHODS FOR VALIDATING PRODUCT AND MANUFACTURING INFORMATION (PMI) FOR MODELS

(71) Applicant: General Electric Company, Schenectady, NY (US)

(72) Inventors: Dawid Tadeusz Machalica, Warsaw (PL); Blake Alexander Dubbs, Greenville, SC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 574 days.

(21) Appl. No.: 16/704,568

(22) Filed: Dec. 5, 2019

(65) Prior Publication Data
US 2020/0184133 A1    Jun. 11, 2020

(30) Foreign Application Priority Data
Dec. 10, 2018   (PL) .......................................... 428099

(51) Int. Cl.
*G06F 30/27*   (2020.01)
*G06F 30/12*   (2020.01)
*G06N 20/00*   (2019.01)
*G06T 19/20*   (2011.01)

(52) U.S. Cl.
CPC .............. *G06F 30/27* (2020.01); *G06F 30/12* (2020.01); *G06N 20/00* (2019.01); *G06T 19/20* (2013.01); *G06T 2219/004* (2013.01); *G06T 2219/012* (2013.01)

(58) Field of Classification Search
CPC .......... G06F 30/27; G06F 30/12; G06F 30/20; G06N 20/00; G06N 5/04; G06N 3/08; G06N 20/10; G06T 19/20; G06T 2219/004; G06T 2219/012; G06T 19/00
See application file for complete search history.

(56) References Cited

U.S. PATENT DOCUMENTS

| 2009/0213116 | A1 | 8/2009 | Konev et al. |
| 2017/0357405 | A1 | 12/2017 | Harvey |
| 2018/0268536 | A1* | 9/2018 | Byers ...................... G06F 30/00 |

(Continued)

FOREIGN PATENT DOCUMENTS

| WO | 2014193736 A1 | 12/2014 |
| WO | 2015183539 A1 | 12/2015 |

OTHER PUBLICATIONS

Lipman et al. "Conformance checking of PMI representation in CAD model STEP data exchange files", Apr. 20, 2015, Computer Aided Design, vol. 66, Elsevier Ltd. (Year: 2015).*

(Continued)

*Primary Examiner* — Chong Wu
(74) *Attorney, Agent, or Firm* — Fletcher Yoder, P.C.

(57) ABSTRACT

A system includes a processor for implementing a computer-aided technology (CAx) system. The CAx system includes a graphical-user-interface (GUI) configured to present a computer-aided design (CAD) model that includes at least one part. The system also includes memory storing instructions configured to cause the processor to receive the CAD model and product and manufacturing information (PMI) associated with the CAD model, validate the PMI, and present the CAD model with validated PMI via the GUI.

20 Claims, 6 Drawing Sheets

(56) References Cited

U.S. PATENT DOCUMENTS

| | | |
|---|---|---|
| 2018/0268614 A1 | 9/2018 | Byers et al. |
| 2018/0322222 A1 | 11/2018 | Cochrane et al. |
| 2018/0322694 A1 | 11/2018 | Byers et al. |
| 2019/0113905 A1* | 4/2019 | Corr .................... G05B 19/408 |

OTHER PUBLICATIONS

Poland Preliminary Opinion/Search Report for PL Application No. P.428099 dated Dec. 14, 2019, 4 pgs.

* cited by examiner

SYSTEMS AND METHODS FOR VALIDATING PRODUCT AND MANUFACTURING INFORMATION (PMI) FOR MODELS

CROSS-REFERENCE TO RELATED APPLICATIONS

This specification is based upon and claims the benefit of priority from Polish patent application number PL P.428099 filed on Dec. 10, 2018, the entire contents of which are incorporated herein by reference.

BACKGROUND

The subject matter disclosed herein relates to systems and methods for validating product and manufacturing information associated with a model, such as models for industrial machine parts.

Industrial machines and machine parts may be developed for a particular purpose, such as a compressor blade developed to compress air. The machine or part may contain many features shared with many portions of the part. Furthermore, these machine parts may include complex designs with many complex features. These features are typically individually managed in a computer aided design (CAD) system, despite their relationship with other components. As such, 3-dimensional (3D) models and/or 2-dimensional (2D) models may be generated to facilitate the manufacturing of the machines and/or the parts. Generally, the features associated with the part may include an attribute of the feature displayed as product and manufacturing information (PMI object), and displaying the PMI object may require a user to manually identify the features associated with the PMI object.

The PMI object may include text (e.g., indicative of PMI or characteristics of a feature) displayed on the model of the part, annotations, callouts, notes, dimensions, and so forth displayed on the drawing and/or model to provide PMI information. In some embodiments, PMI objects may include a visual indication providing PMI information associated with a specific feature designated with the PMI object. Drawings and/or the models of the parts or assemblies may contain PMI objects used to describe a feature of the part. For example, a model may include a first PMI object indicating a first type of PMI information, such as a length of the part; a second PMI object indicating a second type of PMI information, such as a length of an indention of the part; a third PMI object indicating a third set of PMI information, such as dimensions and tolerances of a beveled edge of the part; and the like. It may be beneficial to improve the presentation of PMI objects.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the claimed subject matter. Indeed, the claimed subject matter may encompass a variety of forms that may be similar to or different from the embodiments set forth below.

In a first embodiment, a system includes a processor for implementing a computer-aided technology (CAx) system. The CAx system includes a graphical-user-interface (GUI) configured to present a computer-aided design (CAD) model that includes at least one part. The system also includes memory storing instructions configured to cause the processor to receive the CAD model and product and manufacturing information (PMI) associated with the CAD model, validate the PMI, and present the CAD model with validated PMI via the GUI.

In a second embodiment, a computer-implemented method includes receiving, via a processor, a first computer-aided design (CAD) model and parts and manufacturing information (PMI) associated with the CAD model. The computer-implemented method also includes validating, via the processor, the PMI and presenting, via a graphical user interface (GUI), the CAD model with validated PMI.

In a third embodiment, a tangible, non-transitory, computer-readable medium includes computer-readable instructions that, when executed by one or more processors of a computer, cause the one or more processors to receive a CAD model and product and manufacturing information (PMI) associated with the CAD model, validate the PMI by analyzing a plurality of lines of the PMI, and present the CAD model with validated PMI via a graphical user interface (GUI).

BRIEF DESCRIPTION OF THE DRAWINGS

These and other features, aspects, and advantages of the present claimed subject matter will become better understood when the following detailed description is read with reference to the accompanying drawings in which like characters represent like parts throughout the drawings, wherein:

DETAILED DESCRIPTION

Figure 1:
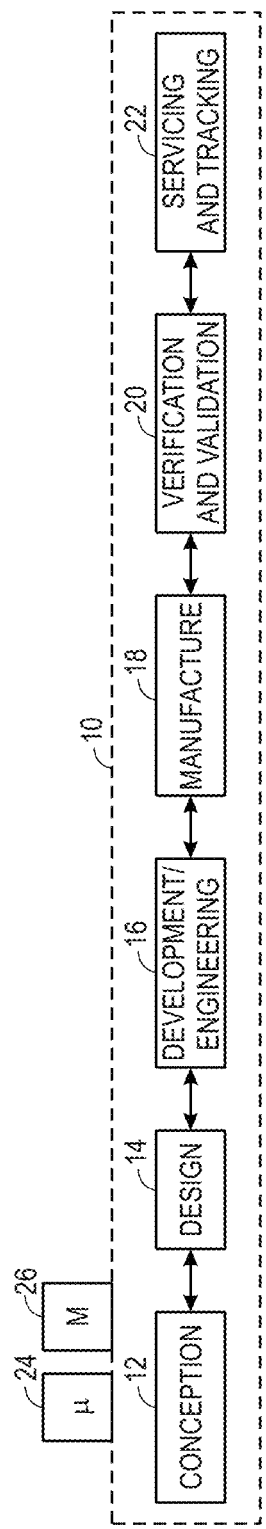
FIG. 1 is a block diagram of an embodiment of a computer-aided technology (CAx) system, in accordance with an aspect of the present disclosure.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present claimed subject matter, the articles "a," "an," "the," and "said" are intended to mean that there are one or more of the elements. The terms "comprising," "including," and "having" are intended to be inclusive and mean that there may be additional elements other than the listed elements.

Developing a machine or part may include certain systems and methods described in more detail below that produce a model of the part. For example, the model of the part may be created as a model-based definition included in a 2-dimensional (2D) or a 3-dimensional (3D) computer aided design (CAD) model. The techniques described herein may include the CAD model containing all part dimensional and tolerance information.

After creating the 3D CAD part, hereinafter referred to as the "part," a drawing and/or model-based definition of the part may be generated by a computer-aided technologies (e.g., CAx) system, whereby the drawing and/or model-based definition may be used to manufacture the part according to the PMI objects (e.g., annotations, callouts, notes, text, etc.) displayed on the drawing and/or model. "Model," used hereinafter, may be used to describe a 2D model, a 3D model, or any other view of a part that may be displayed on a screen, the window of a CAD system, or a sheet of paper as a drawing. As such, drawings and/or the models may contain PMI objects used to describe a feature of the part. For example, there may be an PMI object indicating that an edge has a certain bevel, a certain tolerance, finish, and the like. PMI objects may be associated with annotations (e.g., text) and lines or arrows that indicate a feature of the model to which the annotations relate.

Generally, a designer (e.g., person developing the part and its features) may manually identify certain information (e.g., Product and Manufacturing Information (PMI) for parts in the first model. The details may be used to aid in the manufacturing of the part. For example, each hole may have a PMI information indicating the dimensions of the hole, tolerances for various objects (e.g., faces, edges, holes, etc.), orientation, location, run-out, and so on. In some embodiments, the PMI may adhere to standards such as ASME Y14.41-2003 Digital Product Data Definition Practices and ISO 1101:2004 Geometrical Product Specifications (GPS)—Geometrical tolerancing. Furthermore, PMI objects may be validated so that annotations and lines included in PMI may be presently in a manner that appears natural and/or in accordance with standards. For example, intersections of lines associated with PMI objects may be analyzed, and when an intersection is determined to be improper, one or more lines in the intersection may be modified to remove the improper intersection. For instance, to improve the presentation of annotations and lines of PMI, and thereby make features of CAD drawings and models more discernable, the CAx system may identify the similar features of associated with PMI and automatically modify the manner in which the features are presented, as discussed in detail below.

Additionally, in some cases, model-based definitions, which may include models (e.g., models of a parts or assemblies) with PMI, may be manually altered by an engineer. For example, an engineer may alter the placement PMI objects (e.g., annotations and/or lines). To increase efficiency and/or prevent the inaccuracies that may otherwise result from having an engineer manually orient PMI objects included in model-based designs, present embodiments include systems and methods for automatically reorienting and/or repositioning PMI objects without dependency on human subjectivity. In this manner, present embodiments help transform a traditionally subjective process of placing and/or positioning PMI objects of model-based designs, traditionally performed by humans, into a mathematically automated process that is executable via a process-based device.

With the foregoing in mind, it may be useful to describe a computer-aided technologies (CAx) system that may incorporate the techniques described herein, for example to improve the generation of PMI objects on model-based definitions. Accordingly, FIG. 1 illustrates an embodiment of a CAx system 10 suitable for providing for a variety of processes, including PLM processes 12, 14, 16, 18, 20, 22. In the depicted embodiment, the CAx system 10 may include support for execution of conception processes 12. For example, the conception processes 12 may produce a set of specifications such as requirements specifications documenting a set of requirements to be satisfied by a design, a part, a product, or a combination thereof. The conception processes 12 may also produce a concept or prototype for the part or product (e.g., machine). A series of design processes 14 may then use the specifications and/or prototype to produce, for example, one or more 3D design models of the part or product. The 3D design models may include solid/surface modeling, parametric models, wireframe models, vector models, non-uniform rational basis spline (NURBS) models, geometric models, 2D manufacturing part and assembly drawings, and the like.

Design models may then be further refined and added to via the execution of development/engineering processes 16. The development/engineering processes may, for example, create and apply models such as thermodynamic models, low cycle fatigue (LCF) life prediction models, multibody dynamics (MBD) and kinematics models, computational fluid dynamics (CFD) models, finite element analysis (FEA) models, and/or 3-dimension to 2-dimension FEA mapping models that may be used to predict the behavior of the part or product during its operation. For example, turbine blades may be modeled to predict fluid flows, pressures, clearances, and the like, during operations of a gas turbine engine. The development/engineering processes 16 may additionally result in tolerances, materials specifications (e.g., material type, material hardness), clearance specifications, and the like.

The CAx system 10 may additionally provide for manufacturing processes 18 that may include manufacturing automation support. For example, additive manufacturing models may be derived, such as 3D printing models for material jetting, binder jetting, vat photopolymerization, powder bed fusion, sheet lamination, directed energy deposition, material extrusion, and the like, to create the part or product. Other manufacturing models may be derived, such as computer numeric control (CNC) models with G-code to machine or otherwise remove material to produce the part or product (e.g., via milling, lathing, plasma cutting, wire cutting, and so on). Bill of materials (BOM) creation, requisition orders, purchasing orders, and the like, may also be provided as part of the manufacture processes 18 (or other PLM processes).

The CAx system 10 may additionally provide for verification and/or validation processes 20 that may include automated inspection of the part or product as well as automated comparison of specifications, requirements, and the like. In one example, a coordinate-measuring machine (CMM) process may be used to automate inspection of the part or product. After the part is inspected, results from the CMM process may be automatically generated via an electronic Characteristic Accountability & Verification (eCAV) system.

A servicing and tracking set of processes 22 may also be provided via the CAx system 10. The servicing and tracking processes 22 may log maintenance activities for the part, part replacements, part life (e.g., in fired hours), and so on. As illustrated, the CAx system 10 may include feedback between the processes 12, 14, 16, 18, 20, 22. For example, data from services and tracking processes 22, for example, may be used to redesign the part or product via the design processes 14. Indeed, data from any one of the processes 12, 14, 16, 18, 20, 22 may be used by any other of the processes 12, 14, 16, 18, 20, 22 to improve the part or product or to create a new part or a new product. In this manner, the CAx system 10 may incorporate data from downstream processes and use the data to improve the part or to create a new part.

The CAx system 10 may additionally include one or more processors 24 and a memory system 26 that may execute software programs to perform the disclosed techniques. Moreover, the processors 24 may include multiple microprocessors, one or more "general-purpose" microprocessors, one or more special-purpose microprocessors, and/or one or more application specific integrated circuits (ASICS), or some combination thereof. For example, the processors 24 may include one or more reduced instruction set (RISC) processors. The memory system 26 may store information such as control software, look up tables, configuration data, etc. The memory system 26 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 2:
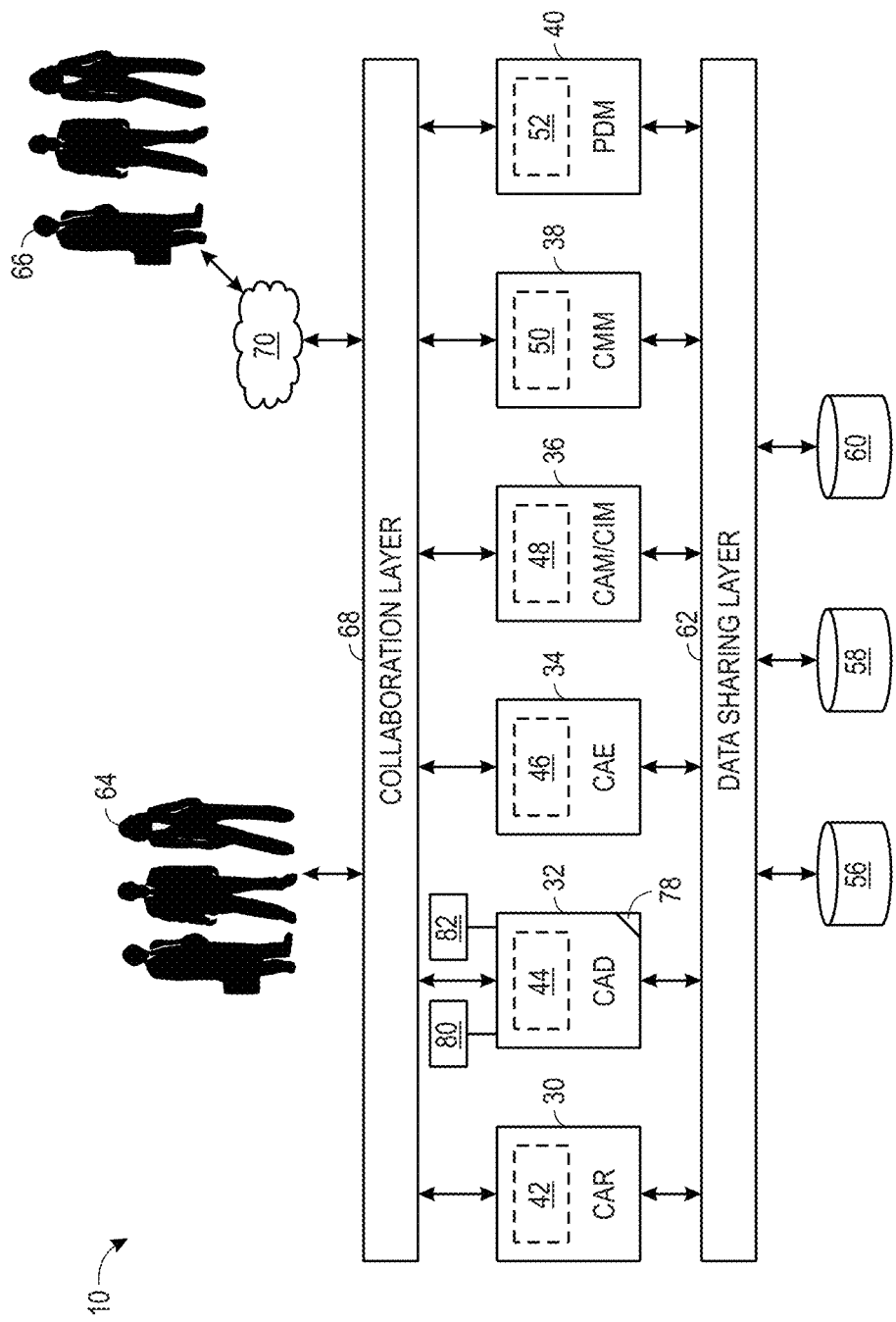
FIG. 2 is a block diagram of a certain components of the CAx system of FIG. 1, in accordance with an aspect of the present disclosure.

The memory system 26 may store a variety of information, which may be suitable for various purposes. For example, the memory system 26 may store machine-readable and/or processor-executable instructions (e.g., firmware or software) for the processors' 24 execution. In one embodiment, the executable instructions include instructions for a number of CAx based systems, for example software systems, as shown in the embodiment of FIG. 2. More specifically, the CAx system 10 embodiment illustrates a computer-aided requirements capture (CAR) system 30, a computer-aided design (CAD) system 32, a computer-aided engineering (CAE) system 34, computer-aided manufacturing/computer-integrated manufacturing (CAM/CIM) system 36, a coordinate-measuring machine (CMM) system 38, and a product data management (PDM) system 40. Each of the systems 30, 32, 34, 36, 38 and 40 may be extensible and/or customizable, accordingly, each system 30 may include an extensibility and customization system 42, 44, 46, 48, 50, and 52, respectively. Additionally, each of the systems 30, 32, 34, 36, 38 and 40 may be stored in a memory system, such as memory system 26, and may be executable via a processor, such as via processors 24.

In the depicted embodiment, the CAR system 30 may provide for entry of requirements and/or specifications, such as dimensions for the part or product, operational conditions that the part or product is expected to encounter (e.g., temperatures, pressures), certifications to be adhered to, quality control requirements, performance requirements, and so on. The CAD system 32 may provide for a graphical user interface suitable to create and manipulate graphical representations of 2D and/or 3D models as described above with respect to the design processes 14. For example, the 3D design models may include solid/surface modeling, parametric models, wireframe models, vector models, non-uniform rational basis spline (NURBS) models, geometric models, and the like. The CAD system 32 may provide for the creation and update of the 2D and/or 3D models and related information (e.g., views, drawings, annotations, notes, PMI object, etc.). Indeed, the CAD system 32 may combine a graphical representation of the part or product with other, related information. Further, the CAD system 32 may create the PMI information and objects displayed on various drawings and model-based definitions displaying multiple views and/or orientations of the same part.

The CAE system 34 may enable creation of various engineering models, such as the models described above with respect to the development/engineering processes 16. For example, the CAE system 34 may apply engineering principles to create models such as thermodynamic models, low cycle fatigue (LCF) life prediction models, multibody dynamics (MBD) and kinematics models, computational fluid dynamics (CFD) models, finite element analysis (FEA) models, and/or 3-dimension to 2-dimension FEA mapping models. The CAE system 34 may then apply the aforementioned models to analyze certain part or product properties (e.g., physical properties, thermodynamic properties, fluid flow properties, and so on), for example, to better match the requirements and specifications for the part or product.

The CAM/CIM system 36 may provide for certain automation and manufacturing efficiencies, for example, by deriving certain programs or code (e.g., G-code) and then executing the programs or code to manufacture the part or product. The CAM/CIM system 36 may support certain automated manufacturing techniques, such as additive (or subtractive) manufacturing techniques, including material jetting, binder jetting, vat photopolymerization, powder bed fusion, sheet lamination, directed energy deposition, material extrusion, milling, lathing, plasma cutting, wire cutting, or a combination thereof. The CMM system 38 may include machinery to automate inspections. For example, probe-based, camera-based, and/or sensor-based machinery may automatically inspect the part or product to ensure compliance with certain geometries, tolerances, shapes, and so on.

The PDM system 40 may be responsible for the management and publication of data from the systems 30, 32, 34, 36, and/or 38. For example, the systems 30, 32, 34, 36, and/or 38 may communicate with data repositories 56, 58, 60 via a data sharing layer 62. The PDM system 40 may then manage collaboration between the systems 30, 32, 34, 36, and/or 38 by providing for data translation services, versioning support, archive management, notices of updates, and so on. The PDM system 40 may additionally provide for business support such as interfacing with supplier/vendor systems and/or logistics systems for purchasing, invoicing, order tracking, and so on. The PDM system 40 may also interface with service/logging systems (e.g., service center data management systems) to aid in tracking the maintenance and life cycle of the part or product as it undergoes operations. Teams 64, 66 may collaborate with team members via a collaboration layer 68. The collaboration layer may include web interfaces, messaging systems, file drop/pickup systems, and the like, suitable for sharing information and a variety of data. The collaboration layer 68 may also include cloud-based systems 70 or communicate with the cloud-based systems 70 that may provide for decentralized computing services and file storage. For example, portions (or all) of the systems 30, 32, 34, 36, 38 may be stored in the cloud 70 and/or accessible via the cloud 70.

The extensibility and customization systems 42, 44, 46, 48, 50, and 52 may provide for functionality not found natively in the CAR system 30, the CAD system 32, the CAE system 34, the CAM/CIM system 36, the CMM system 38 and/or the PDM system 40. For example, computer code or instructions may be added to the systems 30, 32, 34, 36, 38 and/or 40 via shared libraries, modules, software subsystems and the like, included in the extensibility and customization systems 42, 44, 46, 48, 50, and/or 52. The extensibility and customization systems 42, 44, 46, 48, 50, and 52 may also use application programming interfaces (APIs) included in their respective systems 30, 32, 34, 36, 38, and 40 to execute certain functions, objects, shared data, software systems, and so on, useful in extending the capabilities of the CAR system 30, the CAD system 32, the CAM/CIM system 36, the CMM system 38 and/or the PDM system 40. By enabling the processes 12, 14, 16, 18, 20, and 22, for example, via the systems 30, 32, 34, 36, 38, and 40 and their respective extensibility and customization systems 42, 44, 46, 48, 50, and 52, the techniques described herein may provide for a more efficient "cradle-to-grave" product lifecycle management.

For example, the extensibility and customization system 44 of the CAD system 32 may include a PMI validator 78 that may be used validate CAD models, such as a CAD model 80. The CAD model 80 may include PMI that provide information regarding one or more portions of the CAD model 80 (e.g., information regarding measurements, tolerances, or other characteristics of a part or parts included in the CAD model 80). As discussed in detail below, portions of the model 80 to which PMI relate may be visually indicated (e.g., via arrows and/or lines). The PMI validator 78 may determine that the indications associated with PMI are correctly represented and, when not correctly represented, alter the appearance of the indications so that the indications are correctly presented. In other words, the CAD system 32 may generate a model 82 that includes validated PMI. Additionally, in some cases, the appearance of the indications may also be modified to have a "natural" appearance. As used herein, a "natural appearance" refers to a distribution of PMI around a model (e.g., model 80) in accordance with several features are evaluated by the PMI validator 78. For instance, as described below, to determine whether a model has a natural appearance, the PMI validator 78 may make several types of determinations regarding the placement of lines and/or arrows included in PMI. For example, the PMI validator 78 may evaluate whether the lines and/or arrows are spaced apart from one another as well as whether the lines and/or arrows form angles that fall with a range of acceptable angles.

Figure 3:
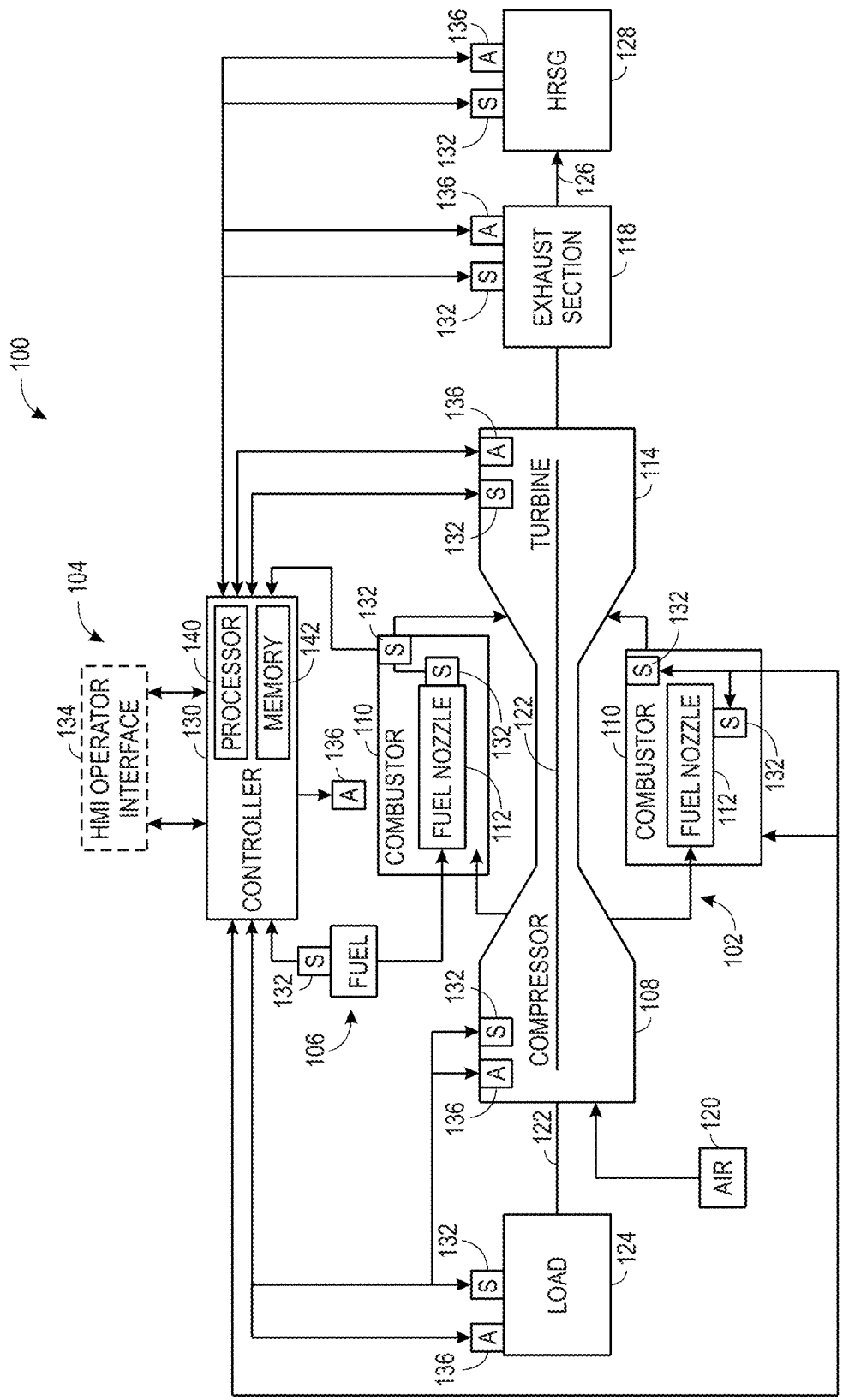
FIG. 3 is block diagram of an industrial system that may be conceived, designed, engineered, manufactured, and/or service and tracked by the CAx system of FIG. 1, in accordance with an aspect of the present disclosure.

It may be beneficial to describe a machine that may incorporate one or more parts manufactured and tracked by the processes 12, 14, 16, 18, 20, and 22, for example, via the CAx system 10. Accordingly, FIG. 3 illustrates an example of a power production system 100 that may be entirely (or partially) conceived, developed, engineered, manufactured, serviced, and tracked by the CAx system 10. As illustrated in FIG. 1, the power production system 100 includes a gas turbine system 102, a monitoring and control system 104, and a fuel supply system 106. The gas turbine system 102 may include a compressor 108, combustion systems 110, fuel nozzles 112, a gas turbine 114, and an exhaust section 118. During operation, the gas turbine system 102 may pull air 120 into the compressor 108, which may then compress the air 120 and move the air 120 to the combustion system 110 (e.g., which may include a number of combustors). In the combustion system 110, the fuel nozzle 112 (or a number of fuel nozzles 112) may inject fuel that mixes with the compressed air 120 to create, for example, an air-fuel mixture.

The air-fuel mixture may combust in the combustion system 110 to generate hot combustion gases, which flow downstream into the turbine 114 to drive one or more turbine stages. For example, the combustion gases may move through the turbine 114 to drive one or more stages of turbine blades, which may in turn drive rotation of a shaft 122. The shaft 122 may connect to a load 124, such as a generator that uses the torque of the shaft 122 to produce electricity. After passing through the turbine 114, the hot combustion gases may vent as exhaust gases 126 into the environment by way of the exhaust section 118. The exhaust gas 126 may include gases such as carbon dioxide ($CO_2$), carbon monoxide (CO), nitrogen oxides ($NO_x$), and so forth.

The exhaust gas 126 may include thermal energy, and the thermal energy may be recovered by a heat recovery steam generation (HRSG) system 128. In combined cycle systems, such as the power production system 100, hot exhaust 126 may flow from the gas turbine 114 and pass to the HRSG 128, where it may be used to generate high-pressure, high-temperature steam. The steam produced by the HRSG 128 may then be passed through a steam turbine engine for further power generation. In addition, the produced steam may also be supplied to any other processes where steam may be used, such as to a gasifier used to combust the fuel to produce the untreated syngas. The gas turbine engine generation cycle is often referred to as the "topping cycle," whereas the steam turbine engine generation cycle is often referred to as the "bottoming cycle." Combining these two cycles may lead to greater efficiencies in both cycles. In particular, exhaust heat from the topping cycle may be captured and used to generate steam for use in the bottoming cycle.

In certain embodiments, the system 100 may also include a controller 130. The controller 130 may be communicatively coupled to a number of sensors 132, a human machine interface (HMI) operator interface 134, and one or more actuators 136 suitable for controlling components of the system 100. The actuators 136 may include valves, switches, positioners, pumps, and the like, suitable for controlling the various components of the system 100. The controller 130 may receive data from the sensors 132, and may be used to control the compressor 108, the combustors of the combustion system 110, the turbine 114, the exhaust section 118, the load 124, the HRSG 128, and so forth.

In certain embodiments, the HMI operator interface 134 may be executable by one or more computer systems of the system 100. A plant operator may interface with the industrial system 10 via the HMI operator interface 134. Accordingly, the HMI operator interface 134 may include various input and output devices (e.g., mouse, keyboard, monitor, touch screen, or other suitable input and/or output device) such that the plant operator may provide commands (e.g., control and/or operational commands) to the controller 130.

The controller 130 may include a processor(s) 140 (e.g., a microprocessor(s)) that may execute software programs to control the industrial system 10 and components thereof. Moreover, the processor 140 may include multiple microprocessors, one or more "general-purpose" microprocessors, one or more special-purpose microprocessors, and/or one or more application specific integrated circuits (ASICS), or some combination thereof. For example, the processor 140 may include one or more reduced instruction set (RISC)

processors. The controller 130 may include a memory device 142 that may store information such as control software, look up tables, configuration data, etc. The memory device 142 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

As described above, drawings and/or models for the aforementioned parts of the industrial machinery may be generated to aid in the processes 12, 14, 16, 18, 20, and 22, for example, via the CAx system 10. Additionally, the extensibility and customization system 44 of the CAD system 32 may include a PMI validator 78 that may be used validate CAD models, such as a CAD model 80. In the model, PMI regarding portions of the model (e.g., information regarding measurements, tolerances, or other characteristics of a part or parts included in the model 80. The PMI validator 78 may determine that indications associated with PMI are correctly represented and, when not correctly represented, alter the appearance of the indications so that the indications are correctly presented. Moreover, in some cases, the appearance of the indications may also be modified to have a "natural" appearance.

Figure 4:
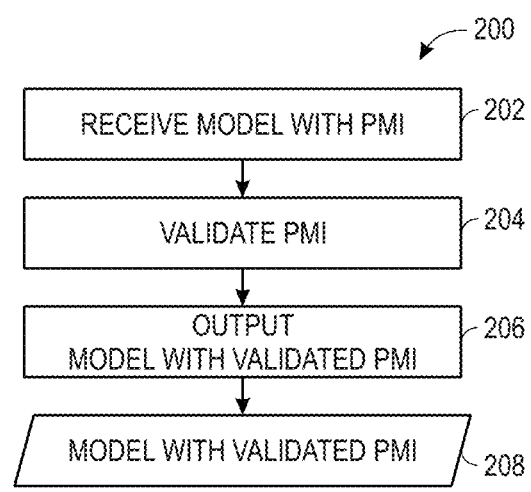
FIG. 4 is a flowchart of a process for validating PMI associated with a CAD model, in accordance with an aspect of the present disclosure.

With this in mind, FIG. 4 is a flowchart of a process 200 for validating PMI associated with models, such as the CAD model 80. The process 200 may be performed by the one or more processors 24 executing the CAD system 32. More specifically, the process 200 may be performed by the one or more processors 24 executing the PMI validator 78 of the CAD system 32. At process block 202, the PMI validator 78 may receive a model with PMI. For example, the model may be a CAD model, such as CAD model 80. The CAD model 80 may be associated with PMI that provide information regarding features of the CAD model 80, such as dimensions, tolerances, or other information associated with one or more parts represented in the model.

At process block 204, the PMI validator 78 may validate the PMI associated with the model 80. While specific examples of how the PMI validator 78 may evaluate PMI as part of the validating the PMI, validating PMI generally refers to determining whether the PMI comply with several rules regarding the appearance and placement of the PMI and/or lines or arrows of the PMI. In particular, the PMI validator 78 may verify intersections between lines associated with PMI (e.g., arrows or extension lines associated with PMI). For example, as discussed below, the PMI validator 78 may determine types of lines associated with annotations (e.g., labels) of the PMI, which types of lines are involved in an intersection, and whether the determined types of lines are permitted to intersect with one another. Furthermore, validating the PMI may include adjusting or reorienting PMI (e.g., moving a location of PMI or reoriented lines), for instance, when the PMI is determined to not comply with the rules regarding the appearance and placement of the PMI and/or lines or arrows of the PMI. PMI has been validated, (e.g., PMI that was determined to comply with the rules or was adjusted in order to comply with the rules) may be referred to as "validated PMI."

Figure 5:
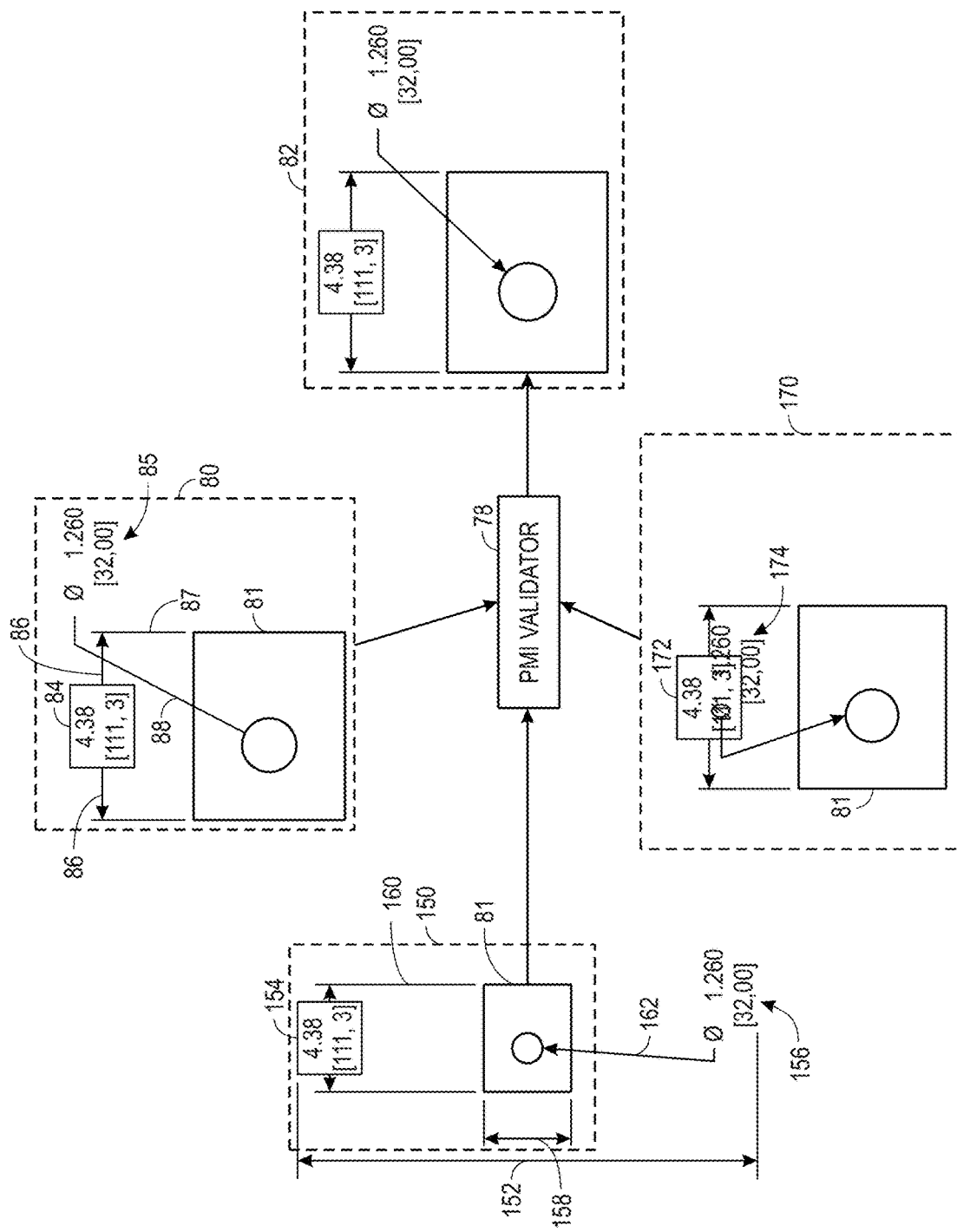
FIG. 5 illustrates several models with PMI that is validated by a PMI validator to produce a model with validated PMI, in accordance with an aspect of the present disclosure.

For example, FIG. 5 illustrates several embodiments of the first model 80 of a part 81 with PMI 84 and a second model 82 of the part 81 with validated PMI. In particular, the first model 80 is associated with PMI 84, 85 (e.g., text annotations or labels (e.g., text annotations inside of a box)). As illustrated, the PMI 84, 85 is also associated with different types of lines. For instance, indicator lines 86 extend from the PMI 84 to indicate that the PMI 84 refers to a dimension (e.g., a width of the part included in the model 80), and the extension lines 87 may further clarify the dimension to which the PMI 84 refers. As also illustrated, the PMI 85 may include a line 88 that intersects one of the extension lines 87.

The PMI validator 78 may determine intersections between the lines 86-88 and determine which types of lines the lines 86-88 are. As part of validating the PMI 84, the PMI validator 78 may determine whether an intersection is permitted based on the types of lines 86-88 involved in the intersection. For example, if the PMI validator 78 determines that lines such as the line 88 intersect an indicator line (e.g., line 86), the PMI validator 78 may determine that such an intersection is invalid and reorient the lines 86. For example, the PMI validator 78 may reorient the lines 86-88 to produce the second model 82 illustrated in FIG. 5. Indeed, referring back to FIG. 4, at process block 206, the PMI validator 78 may output a model with validated PMI 208, such as the second CAD model 82. For instance, the PMI validator 78 may cause the model with validated PMI 208 to be presented via a GUI.

As another example of analyzing the lines 86, if the PMI validator 78 determines that the line 88 intersects the indicator line 86, the PMI validator 78 may determine that the intersection is a valid intersection and proceed to validate other intersections associated with the model 80.

As another example of how the PMI validator 78 may validate the PMI associated with a model, the PMI validator 78 may determine whether annotations (e.g., labels) and lines associated with the annotations are distributed in a natural manner. For example, referring to model 150 of FIG. 5, to determine whether the annotations are distributed in a natural manner, the PMI validator 78 may determine lengths of lines associated with annotations (e.g., lines that indicate which part of the model 150 portions of the PMI is associated with). The model 150 includes the same part 81 as the model 80, but includes PMI that is positioned differently than the PMI 84, 85 of the model 80. The PMI validator 78 may determine a total distance 152 of one or more dimensions (e.g., lengths) associated with PMI of the model 150. For instance, the PMI validator 78 may determine that a first annotation (e.g., PMI 154) is positioned a first distance above the model 150, that a second annotation (e.g., PMI 156) is positioned a second distance below the model 150, and that a dimension 108 (e.g., taken along the same orientation as the first and/or second distances) of the model 150 or part 81 may be a third distance. The PMI validator 78 may determine a total dimension (e.g., total distance 158), determine a ratio of the third dimension to the total dimension (e.g., by dividing the third dimension by the total dimension), and compare the ratio to a threshold. When the ratio falls above or below the threshold, the PMI validator 78 may reposition PMI associated with the model 150, move or reorient lines 160, 162 associated with the PMI, or a combination thereof. For example, the ratio being below a first threshold may indicate that PMI is positioned too far from a part within a model, whereas the ratio being greater than another threshold may indicate that the PMI is positioned to closely to the part included in the model.

Figure 6:
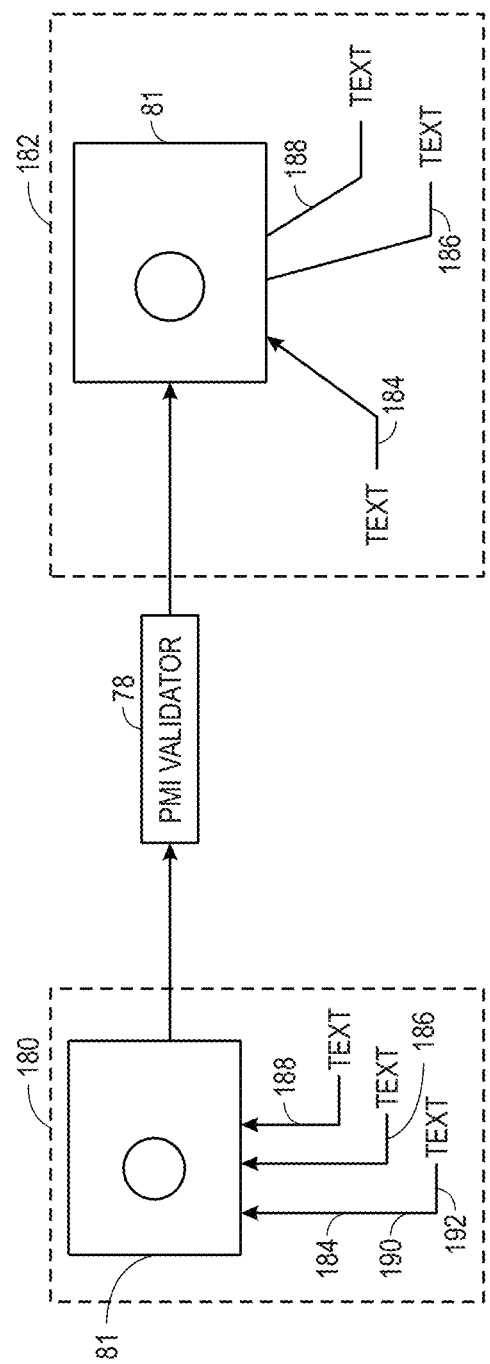
FIG. 6 illustrates another model with PMI that is validated by the PMI validator of FIG. 5 to produce a model with validated PMI, in accordance with an aspect of the present disclosure.

As a further example of determining whether annotations are distributed in a natural manner, the PMI validator 78 may analyze patterns of lines or arrows associated with the PMI. For example, FIG. 6 depicts that the PMI validator 78 may receive a model 180, validate PMI associated with the model 180, and generate a second model 182 that is associated with validated PMI. In particular, the model 180, which includes the same part 81 as the model 80, is associated with PMI that is associated with a first line 184, a second line 186, and a third line 188. The PMI validator 78 may determine that one or more of the lines 184, 186, 188 do not appear in a natural manner, reorient the lines 184, 186, 188, and generate the second model 182, which, as illustrated, is associated with lines 184, 186, 188 that have been reoriented. In other words, the second model 182 may be a different view of the model 180 that includes validated PMI.

The PMI validator 78 may analyze the lines 184, 186, 188 in several ways to determine whether the lines 184, 186, 188 appear in a natural manner. For example, the PMI validator 78 may measure distances between the lines 184, 186, 188 and compare the distances to one or more thresholds (e.g., predetermined distance values (e.g., minimum and maximum distance thresholds)). When one or more of the distances is less than the threshold (e.g., a minimum distance threshold), the PMI validator 78 may reorient any of the lines 184, 186, 188 that are too close to one another.

As another example, the PMI validator 78 may determine an angle formed by two of the lines 184, 186, 188 and compare the angle to a minimum angle threshold and a maximum threshold. When an angle formed by two of the lines 184, 186, 188 does not fall within a range defined by the minimum angle threshold and the maximum angle threshold, the PMI validator 78 may reorient any of the lines 184, 186, 188 that are too close to one another. For instance, the PMI validator 78 may determine that an angle between the first line 184 and the second line 186 is 180°, which may exceed the maximum angle threshold. Accordingly, the PMI validator 78 may reorient the first line 184 and/or the second line 186 (e.g., as depicted by the lines 184, 186 associated with the second model 182). Similarly, the PMI validator 78 may determine an angle formed by a single line, such as the first line 184. For instance, the PMI validator 78 may determine an angle formed by a first portion 190 of the first line 86e and a second portion 192 of the first line 86e. The PMI validator 78 may compare such an angle to one or more thresholds, such as a minimum angle threshold and a maximum angle threshold. When the angle is determined to be less than the minimum angle threshold or greater than the maximum angle threshold, the PMI validator 78 may modify the first line 184 such that the angle falls in a range of values between the minimum angle threshold and the maximum angle threshold. For instance, in FIG. 6, the PMI validator 78 may determine that the angle between the first portion 190 and the second portion 192 of the first line 184 is less than a minimum angle threshold and modify the first line 184 so that the first portion 190 and second portion 192 of the first line 184 form an angle that is equal to or greater than the minimum angle threshold and less than or equal to the maximum angle threshold.

Moreover, it should be noted that several ranges may be defined by thresholds. For example, a range may be defined by a first minimum angle threshold and a first maximum angle threshold, and a second range may be defined by a second minimum angle threshold, which may be greater than the first maximum angle threshold, and a second maximum angle threshold. The PMI validator 78 may determine whether an angle falls into ones of the ranges and adjust PMI when the angle does not fall within one of the ranges.

As yet another example of how the PMI validator 78 may validate PMI, the PMI validator 78 may determine whether text (e.g., labels) included as part of PMI overlap. For instance, referring to model 170 of FIG. 5, which also includes the same part 81 as the model 80, PMI presented in the form of text with the CAD model 170 may overlap or partially overlap with other PMI, lines of the PMI, or the CAD model 170 itself. For instance, in FIG. 5, the PMI 172 and PMI 174 overlap with one another. The PMI validator 78 may determine whether such an overlap exists. Moreover, in the case that the PMI validator 78 determines that an overlap exists, the PMI validator 78 may alter the PMI (e.g., labels or text) to remove the overlap. For instance, in response to receiving the model 80c with the PMI 172 and PMI 174, the PMI validator 78 may output the second model 82.

Furthermore, the CAD system 32 and PMI validator 78 may employ machine learning systems (e.g., neural networks, support vector machines, data mining clustering systems, and so on), that are trained to validate PMI. For example, the PMI validator 78 may utilize machine learning systems trained to determine parameters or rules associated with PMI to be utilized to validate PMI. For instance, the machine learning systems may determine weights for several factors and apply the weighted factors to determine whether PMI is valid. In one example, the machine learning techniques may include lengths of lines of the PMI, angles associated with lines of the PMI, and intersections associated with the lines of the PMI. However, in other embodiments, only some of these factors may be utilized, while in other embodiments, the PMI validator 78 may use other factors. Moreover, the PMI validator 78 may also utilize machine learning systems to determine values for thresholds described above.

Technical effects of the presently disclosed techniques include enabling processors to validate PMI associated with models, such as CAD models. In particular, the techniques discussed above enable computing devices to analyze annotations associated with PMI and lines associated with annotations and to modify the annotations and/or lines so that the annotations and lines appear properly when displayed.

This written description uses examples to disclose the claimed subject matter, including the best mode, and also to enable any person skilled in the art to practice the claimed disclosure, including making and using any devices or systems and performing any incorporated methods. The patentable scope of the claimed disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:
1. A system comprising:
a processor for implementing a computer-aided technology (CAx) system, the CAx system comprising a graphical-user-interface (GUI) configured to present a computer-aided design (CAD) model, the CAD model comprising at least one part;

memory storing instructions configured to cause the processor to:
receive the CAD model and product and manufacturing information (PMI) associated with the CAD model, wherein the PMI comprises lines;
validate the PMI by analyzing one or more intersections between the lines of the PMI; and
present the CAD model with validated PMI via the GUI.

2. The system of claim 1, wherein the instructions are configured to cause the processor to validate the PMI by:
determining whether the one or more intersections are valid; and
reorienting at least one of the lines when one or more of the intersections are determined to be invalid.

3. The system of claim 1, wherein the instructions are configured to cause the processor to analyze the one or more intersections between the lines associated with the PMI by determining one or more types of the lines.

4. The system of claim 3, wherein the one or more types of the lines comprise extension lines and indicator lines, wherein the indicator lines indicate a first annotation of one or more annotations associated with PMI and one or more extension lines associated with the first annotation.

5. The system of claim 3, wherein the instructions are configured to cause the processor to:
analyze the one or more intersections by determining whether a line associated with an annotation associated with the PMI intersects an indicator line or an extension line; and
cause the line associated with the annotation to intersect the extension line when the line is determined to intersect the indicator line.

6. The system of claim 1, wherein the instructions are configured to cause the processor to validate the PMI by:
utilizing a machine learning system trained to determine parameters associated with the PMI; and
evaluate the PMI based on the parameters.

7. The system of claim 1, wherein the instructions are configured to cause the processor to validate the PMI by determining one or more lengths of one or more lines associated with one or more annotations of the PMI.

8. The system of claim 1, wherein the instructions are configured to cause the processor to validate the PMI by analyzing lengths of the lines and an orientation of the lines.

9. The system of claim 1, wherein at least a portion of the PMI corresponds to a measurement associated with the at least one part.

10. The system of claim 1, wherein the at least a portion of the PMI corresponds to a tolerance associated with a portion of the at least one part.

11. The system of claim 1, wherein the instructions are configured to cause the processor to:
determine an angle between two of the lines of the PMI or two portions of one of the lines of the PMI; and
validate the PMI by:
modifying at least one of the two lines when the angle is less than a first minimum threshold or greater than a first maximum threshold; or
modifying at least one of the two portions of the one of the lines when the angle is less than a second minimum threshold or greater than a second maximum threshold.

12. A computer-implemented method, comprising:
receiving, via processor, a first computer-aided design (CAD) model and parts and manufacturing information (PMI) associated with the CAD model;
determining, via the processor, an angle between two lines of the PMI or two portions of a line of the PMI;
validating, via the processor, the PMI by:
modifying at least one of the two lines when the angle is less than a first minimum threshold or greater than a first maximum threshold; or
modifying at least one of the two portions of the line when the angle is less than a second minimum threshold or greater than a second maximum threshold; and
presenting, via a graphical user interface (GUI), the CAD model with validated PMI.

13. The computer-implemented method of claim 12, wherein validating the PMI comprises analyzing a plurality of lines associated with one or more annotations of the PMI by:
altering a placement of at least one of the plurality of lines;
determining a type for each of the plurality of lines;
determining a distance between lines of the plurality of lines; and
determining one or more intersections among the plurality of lines.

14. The computer-implemented method of claim 12, comprising manufacturing a part based on the CAD model with the validated PMI.

15. A tangible, non-transitory, computer-readable medium, comprising computer-readable instructions that, when executed by one or more processors of a computer, cause the one or more processors to:
receive a CAD model and product and manufacturing information (PMI) associated with the CAD model;
determine an angle between two lines of a plurality of lines of the PMI or two portions of a line of the plurality of lines of the PMI;
validate the PMI by:
modifying at least one of the two lines when the angle is less than a first minimum threshold or greater than a first maximum threshold; or
modifying at least one of the two portions of the line when the angle is less than a second minimum threshold or greater than a second maximum threshold; and
present the CAD model with validated PMI via a graphical user interface (GUI).

16. The tangible, non-transitory, computer-readable medium of claim 15, wherein the instructions are configured to cause the one or more processors to validate the PMI by:
determine a first distance associated with a first annotation, wherein the first annotation is associated with the PMI;
determine a second distance associated with a second annotation, wherein the second annotation is associated with the PMI;
determine a third distance associated with a dimension of a part included in the CAD model, wherein the dimension of the part is associated with the PMI;
determine a total distance of the first distance, second distance, and third distance;
determine a ratio of the third distance to the total distance;
compare the ratio to a threshold; and
modify at least one line of the plurality of lines when the ratio is determined to be less than the threshold.

17. The tangible, non-transitory, computer-readable medium of claim 15, wherein the instructions are configured to cause the one or more processors to:

determine an intersection between the two lines of the plurality of lines;

classify at least one of the two lines as an indicator line or an extension line; and validate the PMI by reorienting at least one of the two lines such that the two lines no longer intersect with one another.

18. The tangible, non-transitory, computer-readable medium of claim 17, wherein:

the angle is between the two portions of the line of the plurality of lines of PMI; and the instructions are configured cause the one or more processors to:

compare the angle to the second minimum threshold; and compare the angle to the second maximum threshold; and validate the PMI by modifying the at least one of the two portions of the line when the angle is less than the second minimum threshold or greater than second the maximum threshold.

19. The tangible, non-transitory, computer-readable medium of claim 17, wherein:

the angle is between the two lines of the plurality of lines of the PMI; and the instructions are configured cause the one or more processors to:

compare the angle to the first minimum threshold; and compare the angle to the first maximum threshold; and validate the PMI by modifying at least one of the two lines when the angle is less than the first minimum threshold or greater than the first maximum threshold.

20. The tangible, non-transitory, computer-readable medium of claim 15, wherein the instructions are configured to cause the one or more processors to validate the PMI by determining whether a first annotation associated with the PMI overlaps with a second annotation associated with the PMI.

* * * * *